United States Patent
Kitazawa et al.

[11] Patent Number: 6,147,571
[45] Date of Patent: Nov. 14, 2000

[54] DUAL-BAND MULTILAYER BANDPASS FILTER

[75] Inventors: Shoichi Kitazawa, Nishinomiya; Toru Yamada, Katano; Toshio Ishizaki, Kobe; Koichi Ogawa, Hirakata; Makoto Fujikawa, Ikoma; Tadanori Fujisawa, Yao; Kaoru Ishida, Shijonawate; Yoshitaka Nagatomi, Suita, all of Japan

[73] Assignee: Matsushita Electric Industrial Co., Ltd., Osaka, Japan

[21] Appl. No.: 09/147,562

[22] PCT Filed: Jul. 31, 1997

[86] PCT No.: PCT/JP97/02660

§ 371 Date: Jan. 20, 1999

§ 102(e) Date: Jan. 20, 1999

[87] PCT Pub. No.: WO98/05120

PCT Pub. Date: Feb. 5, 1998

[30]  Foreign Application Priority Data

Jul. 31, 1996  [JP]  Japan .................................. 8-201614

[51] Int. Cl.[7] .............................. H01P 1/203; H01P 1/213
[52] U.S. Cl. .......................... 333/126; 333/129; 333/134; 333/185; 333/204
[58] Field of Search ..................................... 333/126, 129, 333/134, 202, 204, 185

[56]  References Cited

U.S. PATENT DOCUMENTS

| | | | |
|---|---|---|---|
| 5,184,096 | 2/1993 | Wakino et al. | 333/175 |
| 5,237,296 | 8/1993 | Mandai et al. | 333/204 X |
| 5,248,949 | 9/1993 | Eguchi et al. | 333/204 |
| 5,291,161 | 3/1994 | Saka | 333/204 |
| 5,382,927 | 1/1995 | Okamura et al. | 333/175 |
| 5,719,539 | 2/1998 | Ishizaki et al. | 333/204 |
| 5,815,052 | 9/1998 | Nakajima et al. | 333/175 |

FOREIGN PATENT DOCUMENTS

| | | |
|---|---|---|
| 0641035 | 3/1995 | European Pat. Off. . |
| 5-55809 | 3/1993 | Japan . |
| 6-85506 | 3/1994 | Japan . |

OTHER PUBLICATIONS

H. Miyake et al., "*A Miniaturized Monolithic Dual Band Filter Using Ceramic Lamination Technique for Dual Mode Portable Telephones*" presented at the 1997 IEEE MTT–S International Microwave Symposium, Jun. 11, 1997, Denver, Colorado.

*Primary Examiner*—Robert Pascal
*Assistant Examiner*—Barbara Summons
*Attorney, Agent, or Firm*—Greenblum & Bernstein, P.L.C.

[57]  ABSTRACT

A dual-band multilayer bandpass filter having a first filter unit (18) for filtering a first signal having a first frequency and a second filter unit (19) for filtering a second signal having a second frequency. First and second filter units are arranged in stacked ceramic layers. A first blocking element (20a, 20b; 25a, 25b; 25a', 25b'; 46a, 46b) is coupled to the first filter unit (18) for blocking the second signal from being applied to the first filter unit (18). A second blocking element (21a, 21b; 26a, 26b; 25c, 25d; 27a, 27b) is coupled to the second filter unit (19) for blocking the first signal from being applied to the second filter unit (19).

23 Claims, 18 Drawing Sheets

○ 950 MHz
△ 1.9 GHz

○ 950 MHz
△ 1.9 GHz

DUAL-BAND MULTILAYER BANDPASS FILTER

TECHNICAL FIELD

The present invention relates to a dual-band multilayer bandpass filter used primarily in high frequency circuits.

BACKGROUND ART

Dielectric filters are widely used in cellular telephones and other RF devices, and this use has driven demand for further reductions in size and weight accompanied by performance improvements. Dielectric filters can be broadly classified as devices using coaxial resonators and devices using multilayer resonators. Reducing the size of coaxial resonator devices, however, is generally considered to have nearly reached the practical limit, and multilayer filters are therefore preferable for further reducing the size and weight of RF devices.

EP 0 641 035 A2 discloses a laminated dielectric filter comprising a strip line resonator electrode layer forming plural strip line resonators, and a capacity electrode layer, wherein the strip line resonator electrode layer and capacity electrode layer are sandwiched by two shield electrode layers, and the space between the two shield electrode layers are filled with a dielectric, and the thickness between the strip line resonator electrode layer and capacity electrode layer is set thinner than the thickness between the strip line resonator electrode layer and shield electrode layer and the thickness between the capacity electrode layer and shield electrode layer.

The structure of a dual band bandpass filter built using a conventional coaxial filter is described below with reference to FIGS. 30 to 32. FIG. 30 is a perspective view of a conventional coaxial filter comprising as shown dielectric coaxial resonators 30a and 30b, external electrodes 31a and 31b, inside circumferential electrodes 32a and 32b formed inside through-holes in the dielectric coaxial resonators 30a and 30b, connecting metal 33a and 33b, coupling substrate 34, and base 35. This coaxial filter device is described further below as thus comprising a first coaxial filter with a 950-MHz bandpass and a second coaxial filter with a 1.9-GHz bandpass.

FIGS. 31A and 31B are input and output Smith charts for the first and second coaxial filters, respectively, with impedance at 950 MHz indicated at point 22 and impedance at 1.9 GHz indicated at point 23. The characteristics of each single coaxial filter are such that the first coaxial filter has low impedance to the passband of the second coaxial filter and thus shorts, and the second coaxial filter has low impedance to the passband of the first coaxial filter and thus similarly shorts. A dual-band bandpass filter therefore cannot be produced by simply connecting two such coaxial filters together because the filters short at the passband of the other. Phase shifting is therefore required so that impedance to the passband of the other filter is high and an open state is maintained.

FIG. 32 is a circuit diagram of a one-input, one-output dual-band bandpass filter using conventional coaxial filters. Shown in FIG. 32 are a first coaxial filter 35a and second coaxial filter 35b, and first and second phase shifters 36 and 37. The operation of this dual-band bandpass filter is described below.

The impedance of the first coaxial filter 35a to the passband (1.9 GHz) of the second coaxial filter 35b is increased by the matched phase shifter 36. The impedance of the second coaxial filter 35b to the passband (950 MHz) of the first coaxial filter 35a is likewise increased by the matched phase shifter 37. By thus connecting appropriate phase shifters in line with the coaxial filters, the two filters can be connected without affecting the operation of the other filter, and a bandpass filter with two passband can be provided.

As will be obvious from the above description, however, this design necessitates the use of two coaxial filters together with additional phase shift circuit components. Filter size is thus increased, and there is a limit to the size reductions that can be achieved.

DISCLOSURE OF INVENTION

Therefore, the object of the present invention is to provide a compact, high performance, dual-band multilayer bandpass filter.

To achieve this object, in accordance with the present invention, there is provided a multilayer bandpass filter as defined by the claims.

The multilayer bandpass filter according to the present invention comprises a filter body of plural stacked ceramic sheets forming a first filter and a second filter in the filter body. A one-input, one-output filter can be achieved by providing a matching phase shift circuit for the first filter and the second filter.

A one-input, two-output dividing filter can be further achieved by disposing a phase device only at the input side with two output terminals on the output side.

Alternatively, a two-input, one-output combining filter can be achieved by disposing a phase device only at the output side with two input terminals on the input side.

The number of components required to achieve a dual-band bandpass filter can thus be reduced, and a compact dual-band multilayer bandpass filter with stable, high performance can be achieved within the footprint of a single multilayer filter by providing a phase shift circuit.

BRIEF DESCRIPTION OF DRAWINGS

The present invention will become more fully understood from the detailed description given below and the accompanying diagrams wherein.

BEST MODE FOR CARRYING OUT THE INVENTION

Figure 4:
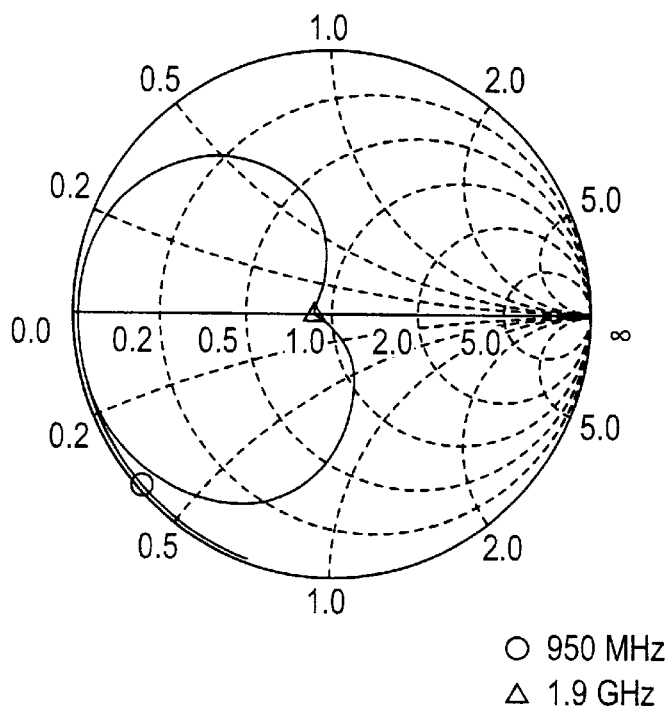
FIG. 4 is a Smith chart for the second filter unit of the multilayer bandpass filter shown in FIG. 2.
Figure 5A:
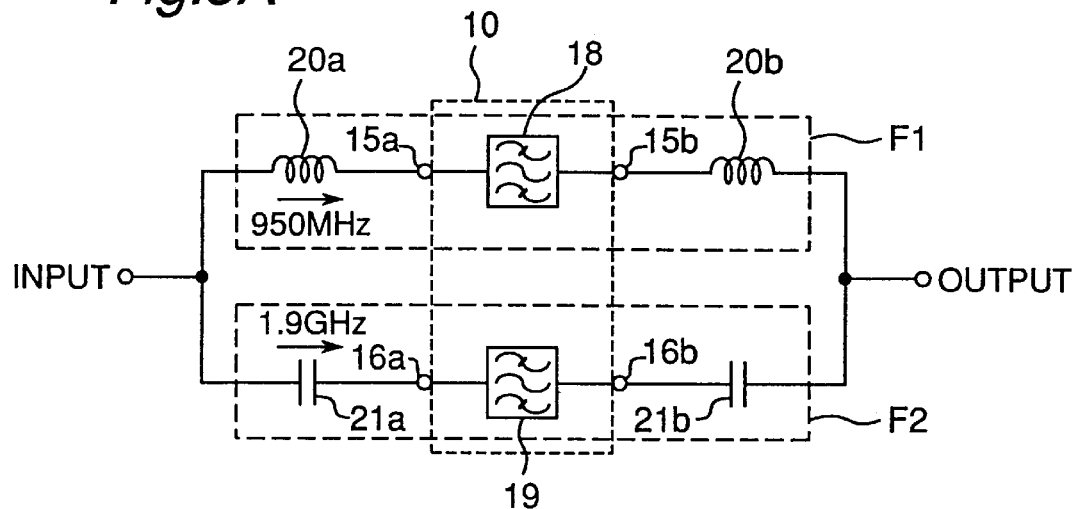
FIG. 5A is a circuit diagram of a dual-band multilayer bandpass filter according to a first embodiment of the present invention.

The preferred embodiments of the present invention are described below with reference to the accompanying FIGS. 1 to 29. As shown in FIG. 5A a dual-band multilayer bandpass filter according to the present invention includes a first filter arrangement F1 and a second filter arrangement F2. Each filter arrangement F1 or F2 includes a primary filter, or filter unit, 18 or 19 and a secondary filter 20a and 20b or 21a and 21b. The multilayer bandpass filter referred to herein includes only the primary filters, such as shown by a block 10 in FIG. 5A, and the dual-band multilayer bandpass filter referred to herein includes the multilayer bandpass filter and the secondary filters connected thereto.

It should be noted here that the first filter arrangement F1, as well as the first filter unit 18, has a 950-MHz bandpass, and the second filter arrangement F2, as well as the second filter unit 19, has a 1.9-GHZ. It is to be noted that the frequencies of these two filter arrangements are given only as examples. Thus, the first and second filter arrangements F1 and F2 may be arranged to pass frequencies other than 950 MHz and 1.9 GHz, respectively, as long as the signal passing through the first filter arrangement F1 has a frequency lower than that of the signal passing through the second filter arrangement F2.

EMBODIMENT 1

Figure 1A:
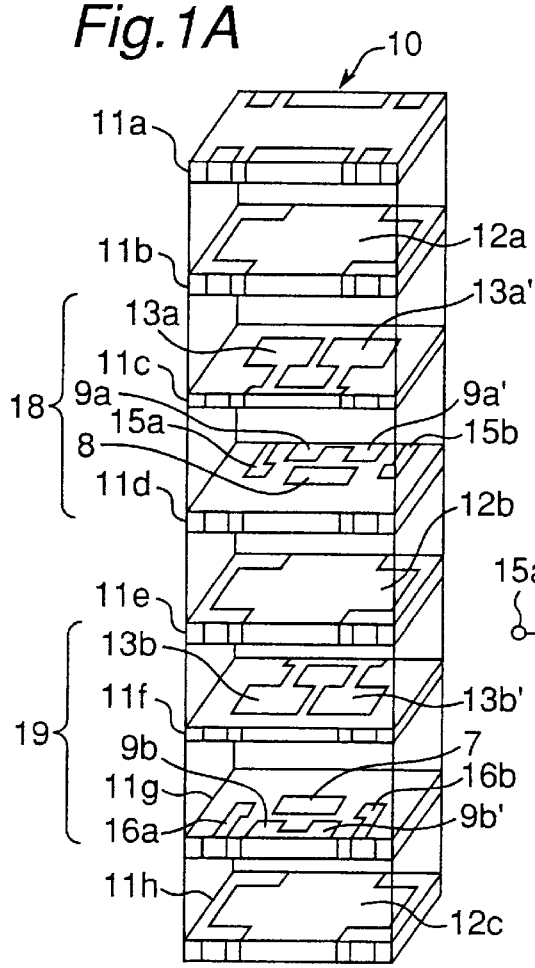
FIG. 1A is an exploded perspective view of a multilayer bandpass filter according to the present invention.
Figure 1B:
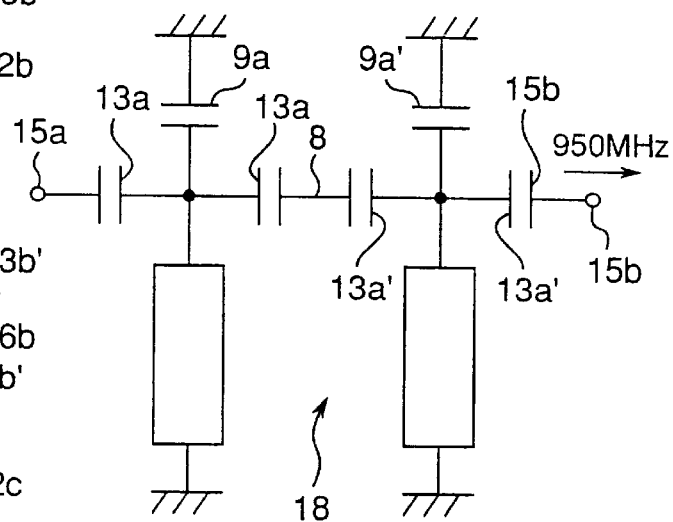
FIG. 1B is an equivalent circuit diagram of a first filter unit of the multilayer bandpass filter shown in FIG. 1A.
Figure 2:
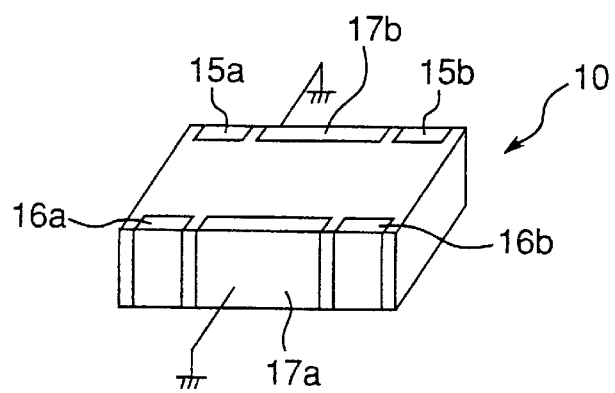
FIG. 2 is a perspective view of an assembled multilayer bandpass filter of FIG. 1A.
Figure 3:
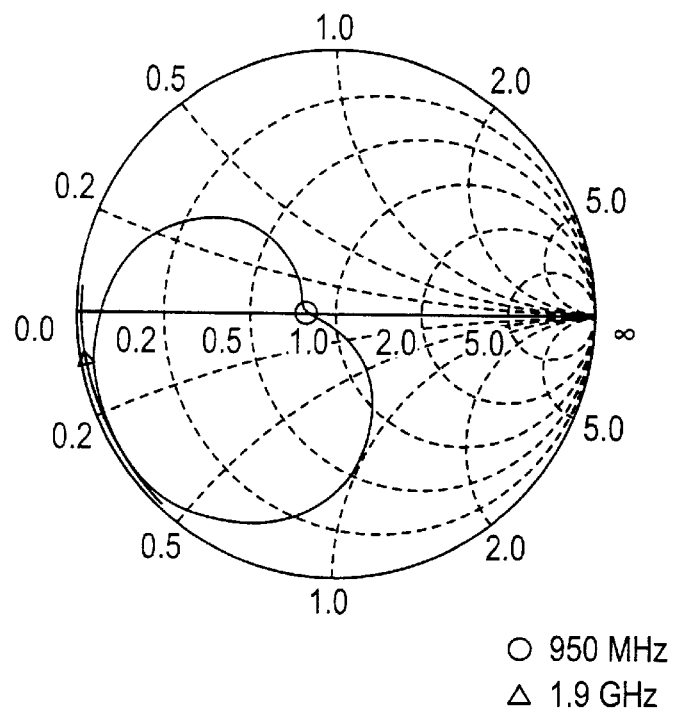
FIG. 3 is a Smith chart for the first filter unit of the multilayer bandpass filter shown in FIG. 1.

FIG. 1A is an exploded perspective view of a multilayer bandpass filter according to a first embodiment of the present invention. FIG. 1B is an equivalent circuit of the multilayer bandpass filter of FIG. 1A. FIG. 2 is a perspective view showing the outside of the multilayer bandpass filter after the layers are stacked together. FIGS. 3 and 4 are Smith charts used to describe the phase characteristics of the first and second filters, respectively.

As shown in FIG. 1A, the multilayer filter 10 comprises a first filter unit 18 formed in ceramic layers 11c and 11d, and second filter unit 19 formed in ceramic layers 11f and 11g.

The layer 11c has a quarter-wave strip line resonator formed by electrodes 13a and 13a'. Electrodes 13a and 13a' are connected through a base electrode which is extended onto a front side surface of the layer 11c.

The layer 11d has: an input electrode 15a; capacitance electrodes 9a and 9a' connected through a base electrode which is extended onto a back side surface (not shown) of the layer 11c; a coupling electrode 8 at about the center of the layer 11c; and an output electrode 15b. The input and output electrodes 15a and 15b are extended onto the back side surface.

The input electrode 15a is capacitively coupled to electrode 13a through the ceramic layer 11c, as shown in FIG. 1B. The electrode 13a is capacitively coupled to electrode 9a which is grounded. The electrode 13a is also capacitively coupled to the coupling electrode 8 which is in turn capacitively coupled to electrode 13a'. The electrode 13a' is capacitively coupled to electrode 9a' and also to output electrode 15b. Thus, the first filter unit 18 formed by layers 11c and 11d has an equivalent circuit as shown in FIG. 1B. The size of the electrodes 13a and 13a', as well as the size of other electrodes, are so selected to establish a bandpass filter for filtering 950 MHz.

Similarly, the layer 11f has a quarter-wave strip line resonator formed by electrodes 13b and 13b. The electrodes 13b and 13b' are oriented in opposite direction to that of electrodes 13a and 13a'. Electrodes 13b and 13b' are connected through a base electrode which is extended onto a back side surface of the layer 11f.

The layer 11g has: an input electrode 16a; capacitance electrodes 9b and 9b' connected through a base electrode which is extended onto the front side surface of the layer 11g; a coupling electrode 7 at about the center of the layer 11g; and an output electrode 16b. The input and output electrodes 16a and 16b are extended onto the front side surface.

The second filter unit 19 formed by layers 11f and 11g has an equivalent circuit similar to that shown in FIG. 1B. The size of the electrodes 13b and 13b', as well as the size of other electrodes, are so selected to establish a bandpass filter for filtering 1.9 GHz.

As shown in FIG. 1A, a ceramic layer 11e formed with a shield electrode 12b is provided between the layers 11d and 11f. Also a ceramic layer 11b formed with a shield electrode 12a is provided on top of layer 11c, and a ceramic layer 11h formed with a shield electrode 12c is provided under the layer 11g. Also a ceramic layer 11a is provided on top of layer 11b.

These ceramic layers 11a to 11h have electrodes on one surface as explained above and are laminated together and co-fired to form a multilayer filter 10, as shown in FIG. 2. Front side surfaces of the multilayer filter 10 has ground electrode 17a in the center and input and output electrodes 16a and 16b on the opposite sides of the ground electrode 17a. The ground electrode 17a is connected to electrodes 12a, 13a, 13a', 12b, 9b, 9b' and 12c.

Similarly, back side surface of the multilayer filter 10 has ground electrode 17b in the center and input and output electrodes 15a and 15b on the opposite sides of the ground electrode 17b. The ground electrode 17b is connected to electrodes 12a, 9a, 9a', 12b, 13b, 13b' and 12c. Since the ground electrode 17a is provided between input and output electrodes 16a and 16b, the isolation between the input and output electrodes 16a and 16b is improved. The same can be said to the input and output electrodes 15a and 15b. Thus, multilayer bandpass filter with a good attenuation characteristic can be achieved.

Figure 29:
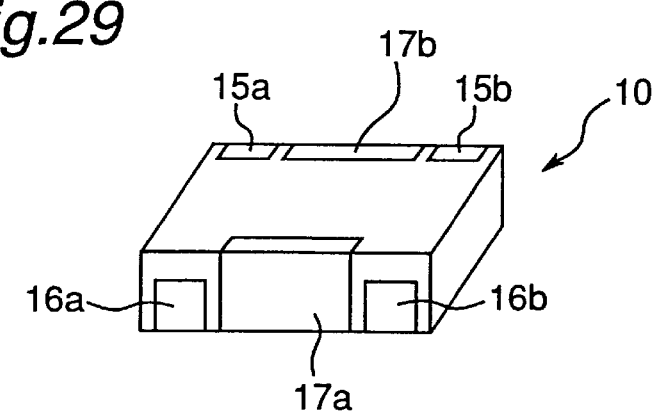
FIG. 29 is a view similar to FIG. 2, but showing a modification thereof.
Figure 30:
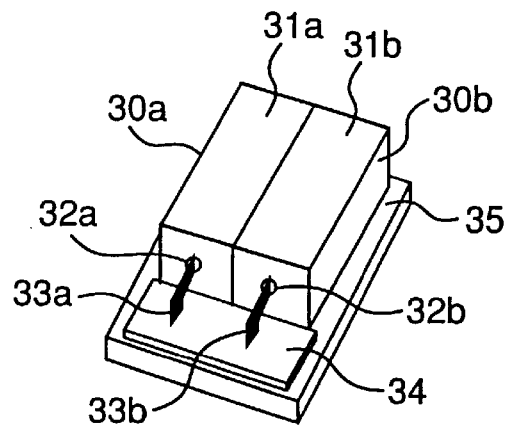
FIG. 30 is a perspective view of a coaxial filter according to prior art.
Figure 31A:
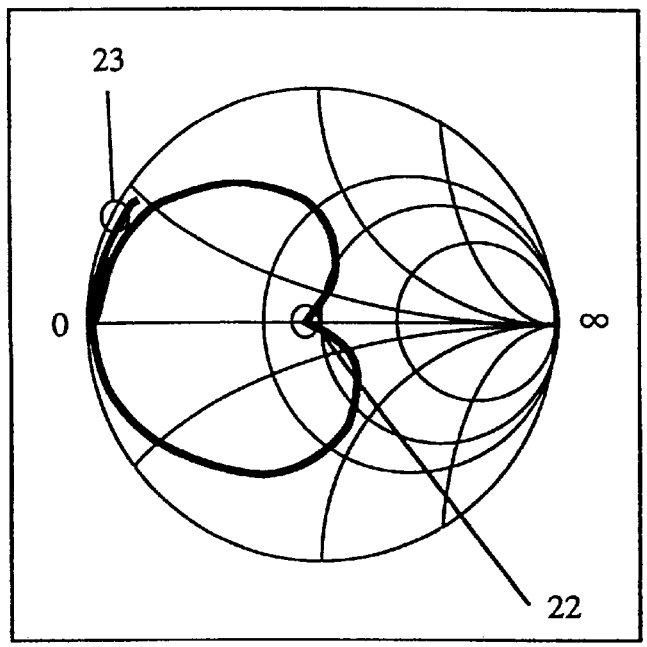
FIGS. 31A and 31B are Smith charts used to describe the first and second coaxial filters shown in FIG. 30.
Figure 31B:
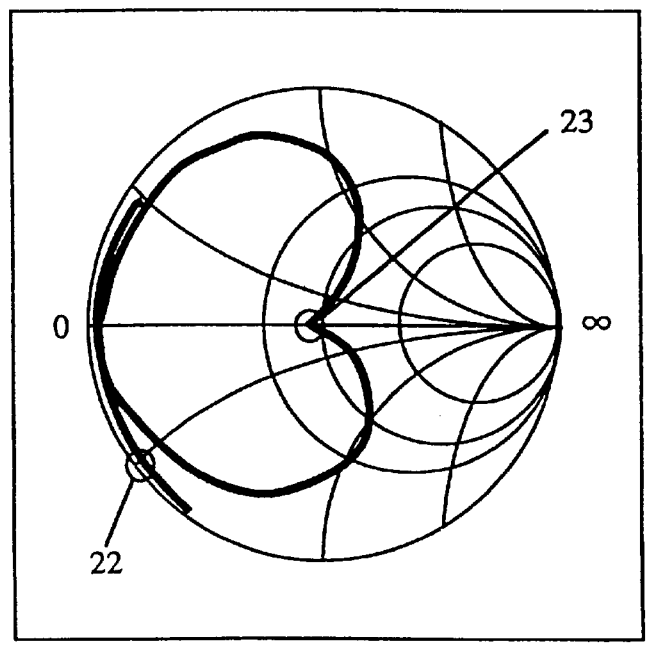
Figure 32:
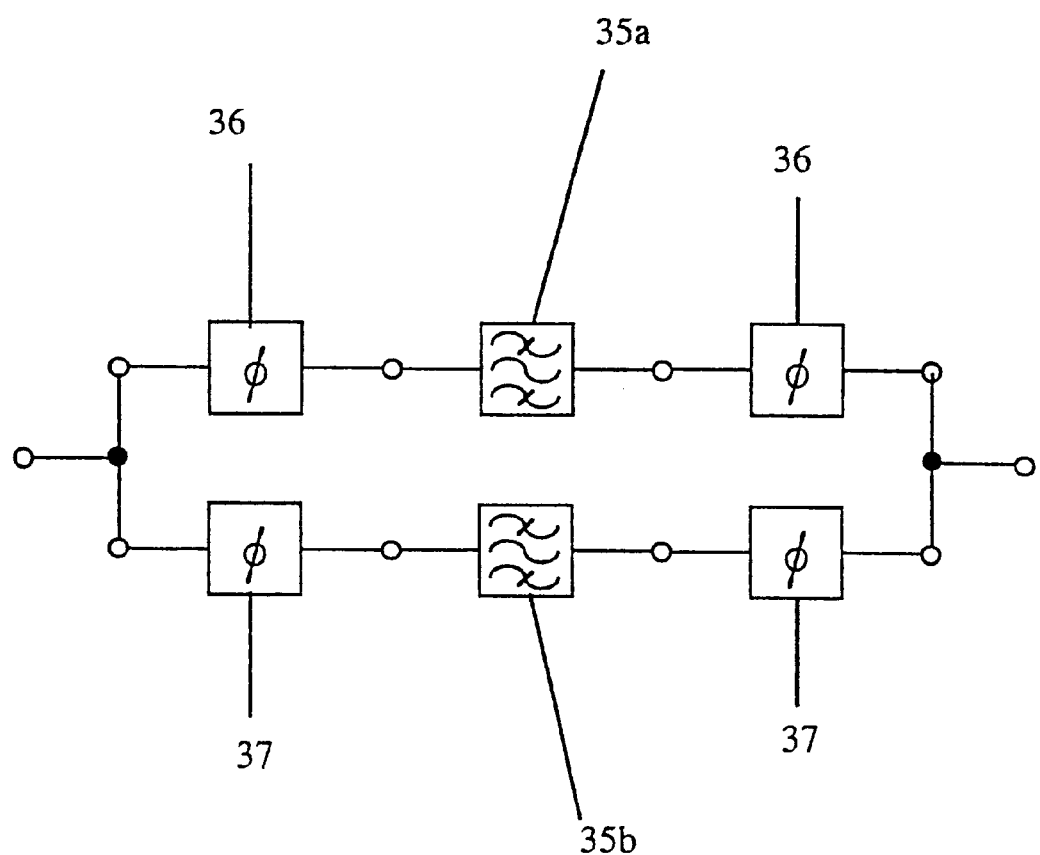
FIG. 32 is a circuit diagram of a dual-band bandpass filter using prior art coaxial filters.

As shown in FIG. 29, input and output electrodes 16a and 16b can be provided only partially along the side surface. This is done for example by removing portions of the electrodes. As the removed part increases, the passband frequency increases. Thus, by adjusting the amount of portion to be removed, it is possible to precisely adjust the filtering frequency. If the electrode is removed more than enough, electrode may be added to decrease the passband frequency.

FIG. 3 shows a Smith chart of the first filter unit 18 for filtering the signal of 950 MHz. As can be seen from FIG. 3, the first filter unit shows about 50Ω matching with respect to 950 MHz signal, and short-circuited with respect to 1.9 GHz.

FIG. 4 shows a Smith chart of the second filter unit 19 for filter the signal of 1.9 GHz. As can be seen from FIG. 3, the first filter unit shows about 50Ω matching with respect to 1.9 GHz signal, and short-circuited with respect to 950 MHz.

In other words, the impedance of the first multilayer filter unit is low at the passband (1.9 GHz) of the second multilayer filter unit, as shown in FIG. 3. Likewise, the impedance of the second multilayer filter unit at the passband (950 MHz) of the first multilayer filter unit is low, as shown in FIG. 4. When these two filters are merely connected parallel to each other, the signal having a passband frequency of the first filter will be grounded in the second filter. Similarly, the signal having a passband frequency of the second filter will be grounded in the first filter. Thus, it is not possible to obtain a filter characteristics having two bandpasses as desired.

Figure 6:
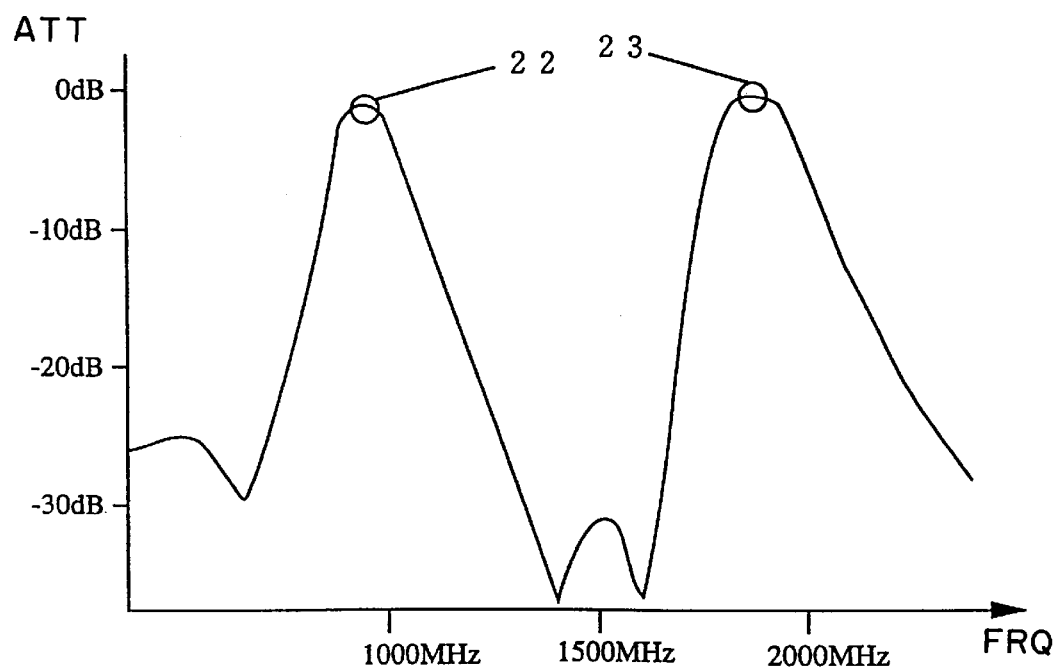
FIG. 6 is a waveform diagram showing the operating characteristics of a dual-band multilayer bandpass filter of FIG. 5A.

It is therefore necessary to prevent the operation of one filter from affecting the operation of the other filter. In other words, when a filter with two bandpasses is to be designed, the first filter should make its impedance high at the passband of the second filter, and the second filter should make its impedance high at the passband of the first filter. A phase shift circuit comprising a lumped element is therefore disposed to the input/output terminals as shown in FIG. 5A. An inductor is thus connected to the input/output terminals of the first multilayer filter unit to increase impedance at the passband (1.9 GHz) of the second multilayer filter unit, and a capacitor is connected in series to the input/output terminals of the second multilayer filter unit to increase impedance at the passband (950 MHz) of the first multilayer filter unit. A filter with two bandpasses, at 950 MHz and 1.9 GHz, and good attenuation at other frequencies, is thus achieved as shown in FIG. 6. A further detail of the arrangement of FIG. 5A is described below.

Referring to FIG. 5A, a dual-band multilayer bandpass filter according to the first embodiment is shown. The dual-band multilayer bandpass filter employs the multilayer filter 10 shown in FIG. 1A. The multilayer filter 10 includes the first filter unit 18 and the second filter unit 19. The first filter unit 18, serving as the primary filter, has its input 15a externally connected to a coil 20a, and its output 15b externally connected to a coil 20b. Coils 20a and 20b serve as the secondary filter which blocks signals in the range of 1.9 GHz, but passes signals in the range of 950 MHz.

Similarly, the second filter unit 19, also serving as the primary filter, has its input 16a externally connected to a capacitor 21a, and its output 16b externally connected to a capacitor 21b. Capacitors 21a and 21b serve as the secondary filter which blocks signals in the range of 950 MHz, but passes signals in the range of 1.9 GHz.

The coil 20a and the capacitor 21a are further connected to each other to form a single input. Likewise, coil 20b and capacitor 21b are connected to each other to form a single output. Thus, the dual-band multilayer bandpass filter shown in FIG. 5A is a one-input one-output type.

FIG. 6 shows the frequency characteristics of the dual-band multilayer bandpass filter of FIG. 5A. As apparent from the graph of FIG. 6, the filter of FIG. 5A has two filtering peak points 22 and 23 at frequencies 950 MHz and 1.9 GHz, respectively.

Figure 5B:
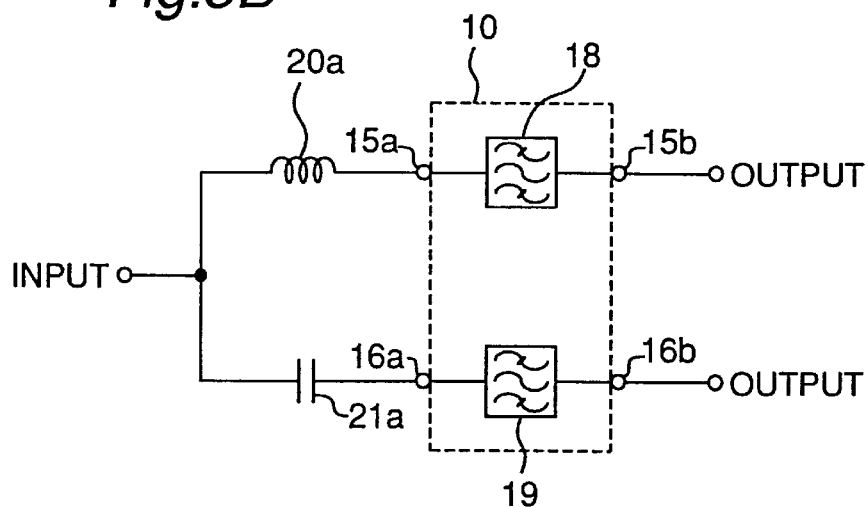
FIG. 5B is a circuit diagram similar to that of FIG. 5A, but showing a modification thereof.

FIG. 5B is a modification of the dual-band multilayer bandpass filter of FIG. 5A, and particularly shows a one-input two-output type, in which the outputs 15b and 16b are freed.

Figure 5C:
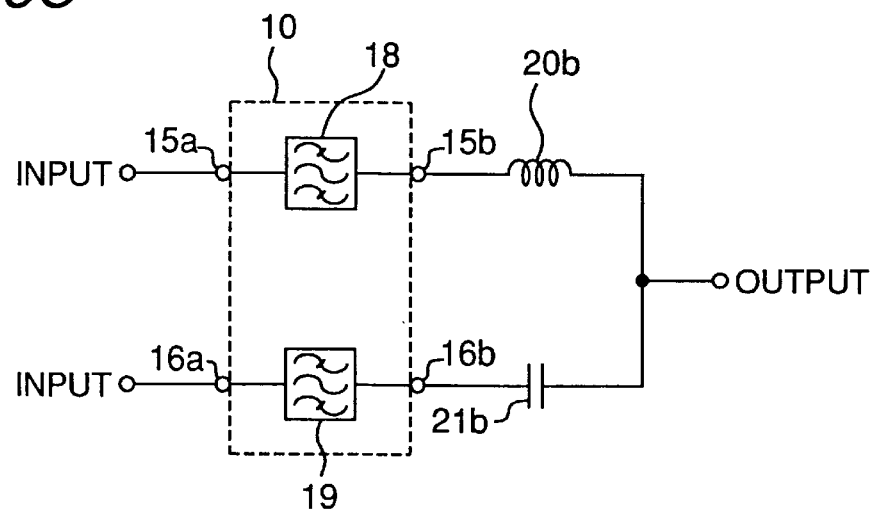
FIG. 5C is a circuit diagram similar to that of FIG. 5A, but showing another modification thereof.

FIG. 5C is another modification of the dual-band multilayer bandpass filter of FIG. 5A, and particularly shows a two-input one-output type, in which the inputs 15a and 16a are freed.

Figure 7A:
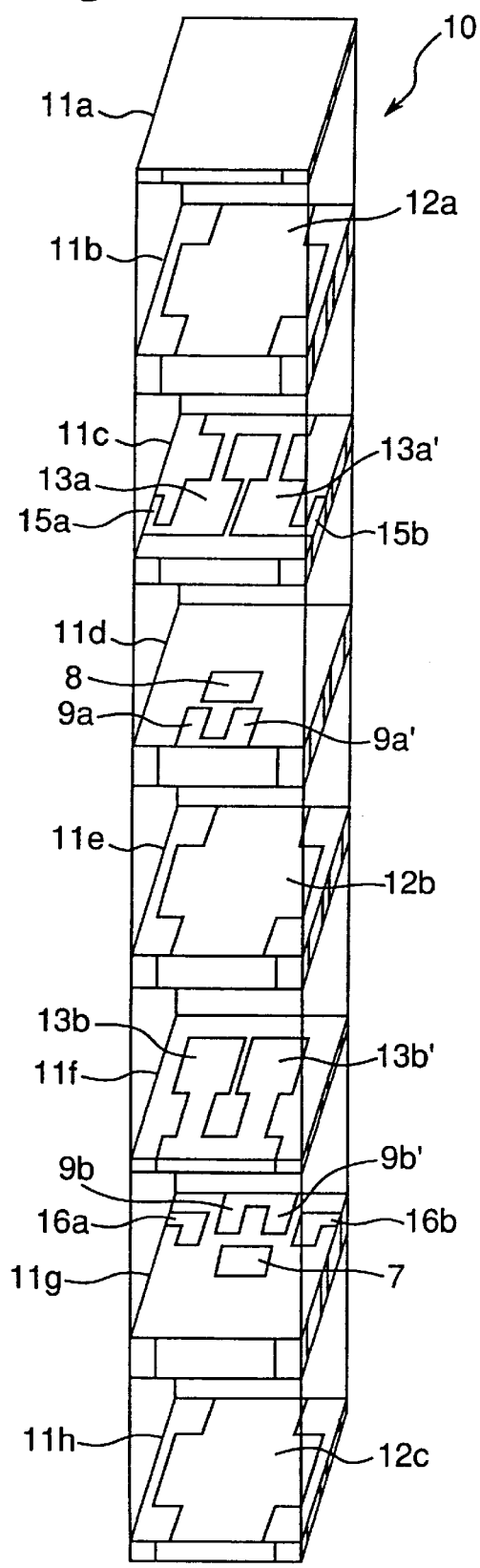
FIG. 7A is a view similar to FIG. 1A, but showing an exploded perspective view of alternative multilayer bandpass filter according to the present invention.
Figure 7B:
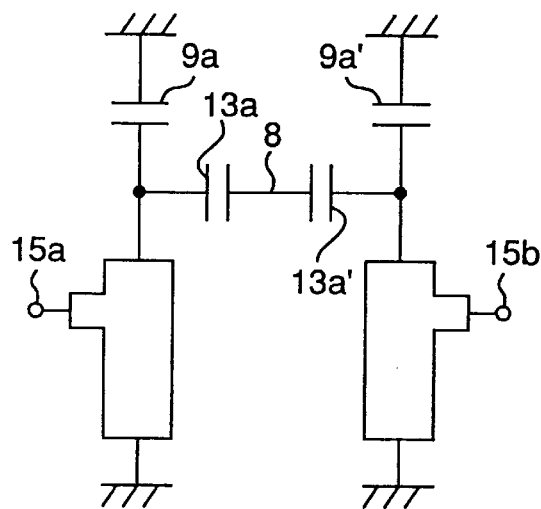
FIG. 7B is an equivalent circuit diagram of a first filter unit of the multilayer bandpass filter shown in FIG. 7A.

Referring to FIG. 7A, a modification of the multilayer bandpass filter 10 is shown. When compared with the multilayer bandpass filter 10 of FIG. 1A, the filter of FIG. 7A has input electrode 15a connected directly to the electrode 13a, and output electrode 15b connected directly to the electrode 13a', as shown in FIG. 7B. Thus, no capacitive coupling between the input electrode 15a and the electrode 13a is formed. Other arrangements are the same as that shown in FIG. 1A.

Figure 8:
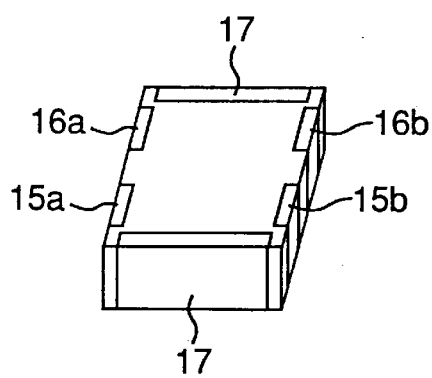
FIG. 8 is a perspective view of an assembled multilayer bandpass filter of FIG. 7A.

FIG. 8 shows the assembled multilayer bandpass filter 10 of FIG. 7A.

The input 15a to the first filter unit 18 in this modification is a power supply tap enabling more strong coupling with the resonator. When viewed in FIG. 8, the inputs 15a and 16a to the first and second filter units are provided on the left side of the multilayer filter 10, and the outputs 15b and 16b are provided on the right side, and the ground electrode 17 are provided on the front side and back side. This filter also is connected with a phase shift circuit to establish a dual-band multilayer bandpass filter. Thus, the isolation between the input and output can be accomplished.

Figure 9:
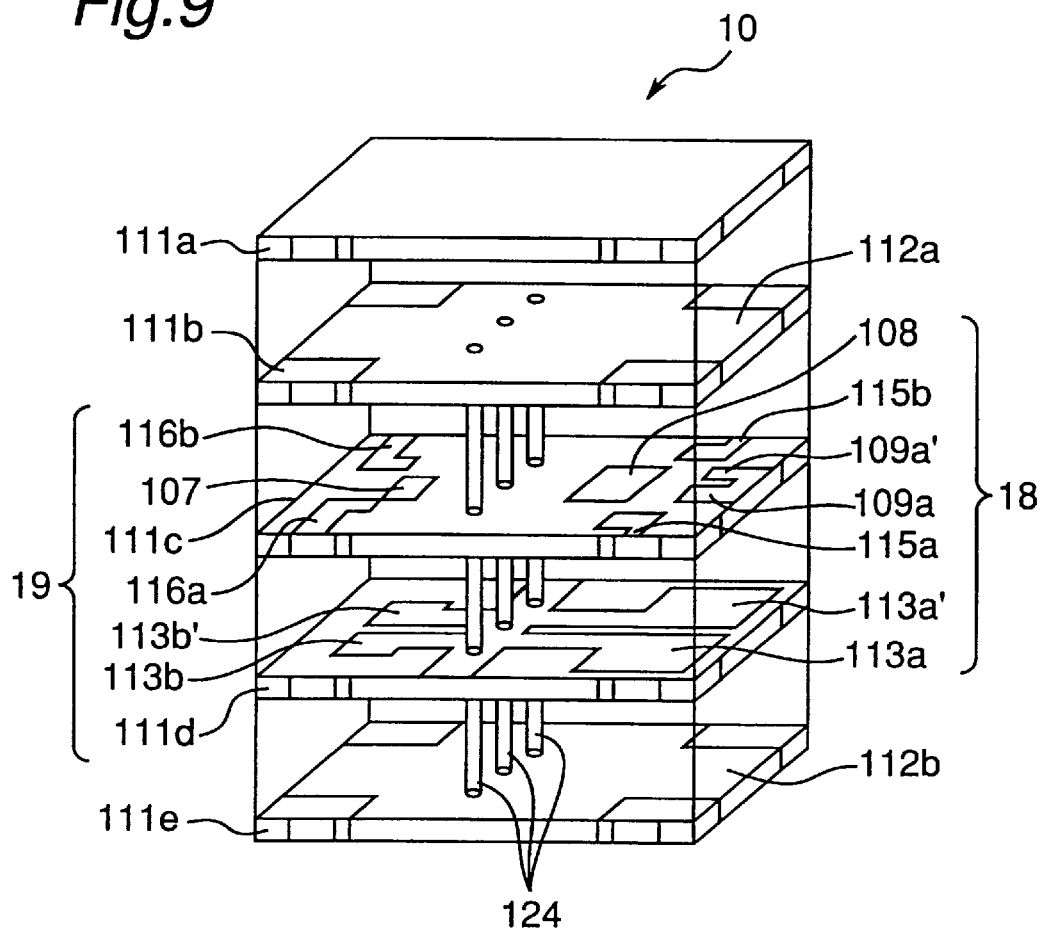
FIG. 9 is a view similar to FIG. 1A, but showing an exploded perspective view of another alternative multilayer bandpass filter according to the present invention.

Referring to FIG. 9, another modification of the multilayer bandpass filter 10 is shown.

The multilayer filter 10 shown in FIG. 9 comprises a first filter unit 18 formed on the right half portion of ceramic layers 111c and 111d, and second filter unit 19 formed on the left half portion of ceramic layers 111c and 111d.

The layer 111c has in its right half portion: an input electrode 115a; capacitance electrodes 109a and 109a' connected through a base electrode which is extended on the right side surface of the layer 111c; a coupling electrode 108; and an output electrode 115b. The input and output electrodes 115a and 115b are extended onto the front and back side surfaces, respectively.

The layer 111c further has in its left half portion: an input electrode 116a; a coupling electrode 107; and an output electrode 116b. The input and output electrodes 116a and 116b are extended onto the front and back side surfaces, respectively.

The layer 111d has in its right half portion a quarter-wave strip line resonator formed by electrodes 113a and 113a'. Electrodes 113a and 113a' are connected through a base electrode which is extended across the center of the layer 111d.

The layer 111d further has in its left half portion a quarter-wave strip line resonator formed by electrodes 113b and 113b'. Electrodes 113b and 113b' are connected through a base electrode which is extended across the center of the layer 111d.

Layers 111b and 111e with shield electrodes 112a and 112b, respectively, are provided on top and bottom of layers 111c and 111d, respectively. A top layer 111a is further provided.

The centers of the layers 111b, 111c and 111d are formed with through-holes 124 for extending a conductive material therethrough. Thus, the ground electrodes are connected through the through-holes 124. In other words, through-holes 124 connect the top and bottom shield electrodes to the short-circuit terminals of the resonator to obtain a good ground and improve the isolation between the first and second filters.

The multilayer bandpass filter shown in FIG. 9 has the first and second filter resonators 18 and 19 on the same surface layers c and 111d. When the multilayer bandpass filter of this modification is manufactured to the same device height as the multilayer bandpass filter of that shown in FIG. 1A or 7A, the gap between the shield layers is greater than when the two bandpass filters are stacked. The Q factor of the resonator is thus higher, and a filter with less loss can be achieved.

By further extending the through-holes to the outside bottom surface of the multilayer bandpass filter 10, a smaller solder area is needed to assure a good ground when mounting the multilayer bandpass filter 10, and the required mounting area can thus be reduced.

Figure 10:
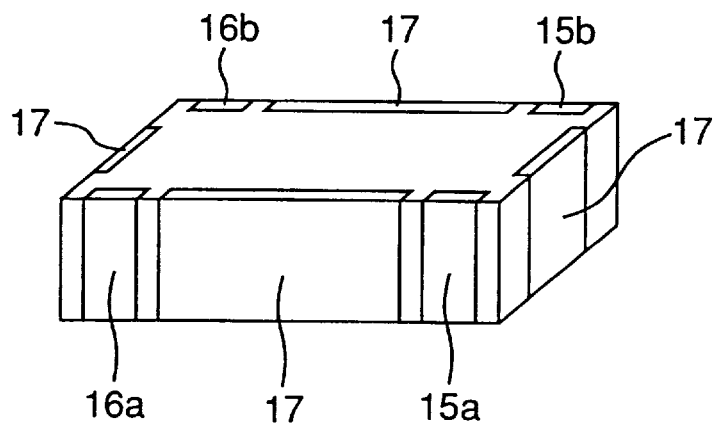
FIG. 10 is a perspective view of an assembled multilayer bandpass filter of FIG. 9.

FIG. 10 shows the input and output locations of the multilayer bandpass filter of FIG. 9.

A one-input and one-output, one-input and two-output, or a two-input and one-output configuration can also be achieved by forming the phase shift circuits as described above.

It is therefore possible to provide a compact dual-band multilayer bandpass filter having one-input and one-output, one-input and two-outputs, or two-inputs and one-output by constructing a two-input, two-output dual-band multilayer bandpass filter comprising a first multilayer filter unit and a second multilayer filter unit in a multilayer filter comprising plural stacked ceramic sheets, and connecting a phase shift circuit thereto as described above.

EMBODIMENT 2

Figure 11:
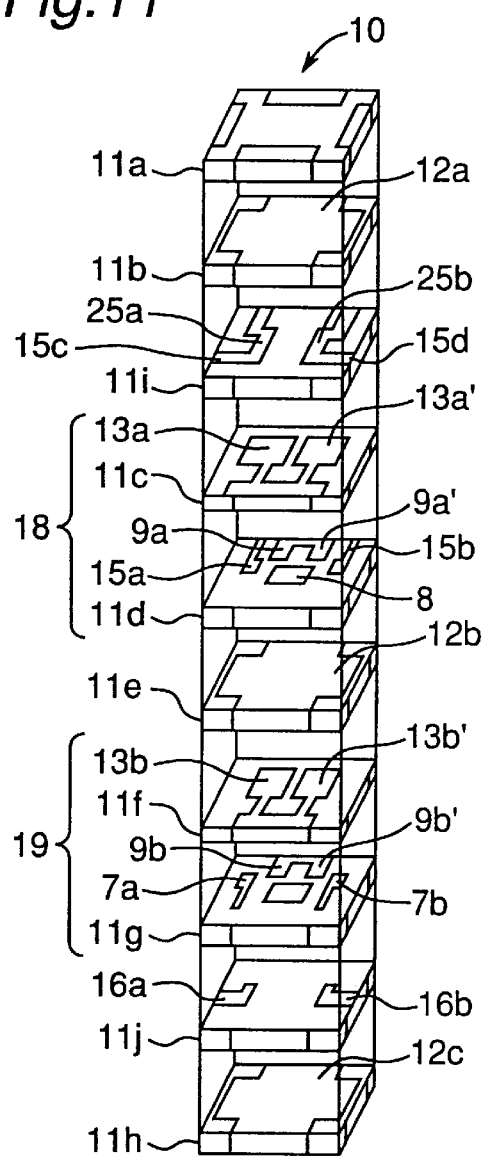
FIG. 11 is an exploded perspective view of a dual-band multilayer bandpass filter according to a second embodiment of the present invention.

Referring to FIG. 11, a second embodiment of the dual-band multilayer bandpass filter is shown. When compared with the first embodiment, such as shown in FIG. 1A, the difference is that ceramic layers 11i and 11j are further provided to form thereon the secondary filters. Furthermore, the quarter-wave strip line resonator formed by electrodes 13b and 13b' is oriented in opposite direction, i.e., in the same direction as the electrodes 13a and 13a'.

Figure 12:
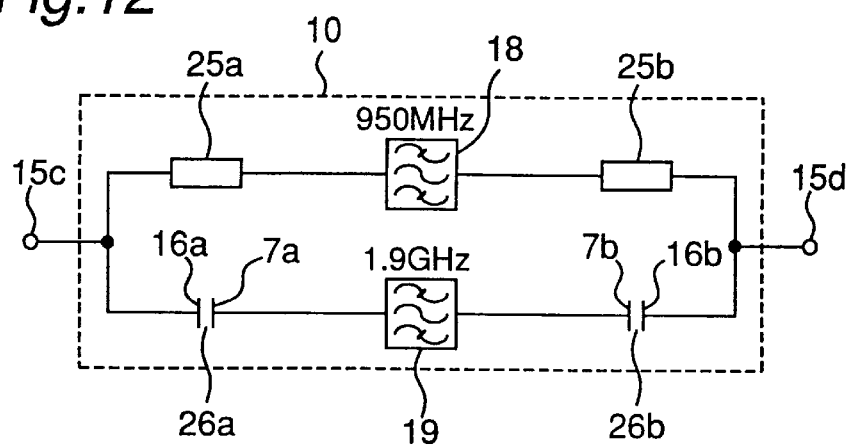
FIG. 12 is a circuit diagram of a dual-band multilayer bandpass filter of FIG. 11.

FIG. 12 shows an equivalent circuit diagram of the dual-band multilayer bandpass filter shown in FIG. 11.

As shown in FIG. 11, the multilayer filter 10 comprises: ceramic sheets 11a to 11h; shield electrodes 12a, 12b, and 12c; quarter-wave strip line resonator electrodes 13a, 13a', 13b and 13b' with each resonator grounded at the same side; capacitance electrodes 9a, 9a', 9b and 9b'; input/output terminals 15a and 15b for the first multilayer filter unit; input/output terminals 16a and 16b for the second multilayer filter unit; transmission lines 25a and 25b; and capacitors 26a (formed between electrodes 7a and 16a) and 26b (formed between electrodes 7b and 16b) forming a phase shift circuit in the second multilayer filter unit. The transmission lines 25a and 25b serve as the secondary filters for the 950 MHz signals, and capacitors 26a and 26b-serve as the secondary filters for the 1.9 GHz signals.

Numerals 15c and 15d are the input and output of the dual-band multilayer bandpass filter, which extend onto the two side surfaces, and connect 25a and 16a, and 25b and 16b, respectively.

The first multilayer filter unit comprises strip line resonator 13a and capacitance layer 11d disposed between shield electrodes 12a and 12b.

In other words, a phase shift circuit for increasing the impedance of the first multilayer filter unit 18 in the passband (1.9 GHz) of the second multilayer filter unit is formed by the transmission lines 25a and 25b.

Also, the impedance of the second multilayer filter unit 19 to the passband (950 MHz) of the first multilayer filter unit is increased by the capacitors 26a and 26b.

It is therefore possible to provide a stable, compact, one-input and one-output dual-band multilayer bandpass filter without using an externally connected phase shift circuit.

According to the multilayer filter 10 shown in FIG. 11, the layers 11a–11j are made of ceramic plate having the same dielectric constant. It is possible, however, to prepare layer 11i with a different ceramic plate having a dielectric constant lower than that in other layers.

It is therefore possible to prevent coupling between the phase shift circuit and the strip line resonator, increase the characteristic impedance of the transmission lines forming the phase shift circuit, and further increase impedance to the bandpass of the second multilayer filter unit. The effect of each filter on the characteristics of the other is thus further reduced, and a dual-band multilayer bandpass filter with yet higher performance can be achieved.

It should be noted that the second embodiment has been described as a one-input, one-output type dual-band multilayer bandpass filter, but other types, such as a one-input, two-output type can be alternatively achieved by disposing a phase shift circuit as described above on the input side only, and providing a first filter output terminal and a second filter output terminal on the output side.

A two-input, one-output type can also be achieved by disposing a phase shift circuit as described above on the output side only with two terminals, one terminal for the first filter and one terminal for the second filter, provided on the input side.

It will also be obvious that while the resonators used in the dual-band multilayer bandpass filters described above are quarter-wave resonators grounded on one side, half-wave resonators and other types of resonators can be alternatively used. In addition, the dual-band multilayer bandpass filter of the invention has been described using only two resonators above, but three or more plural resonators can be used to the same effect.

The above three paragraphs apply to other embodiments described below.

EMBODIMENT 3

Figure 13:
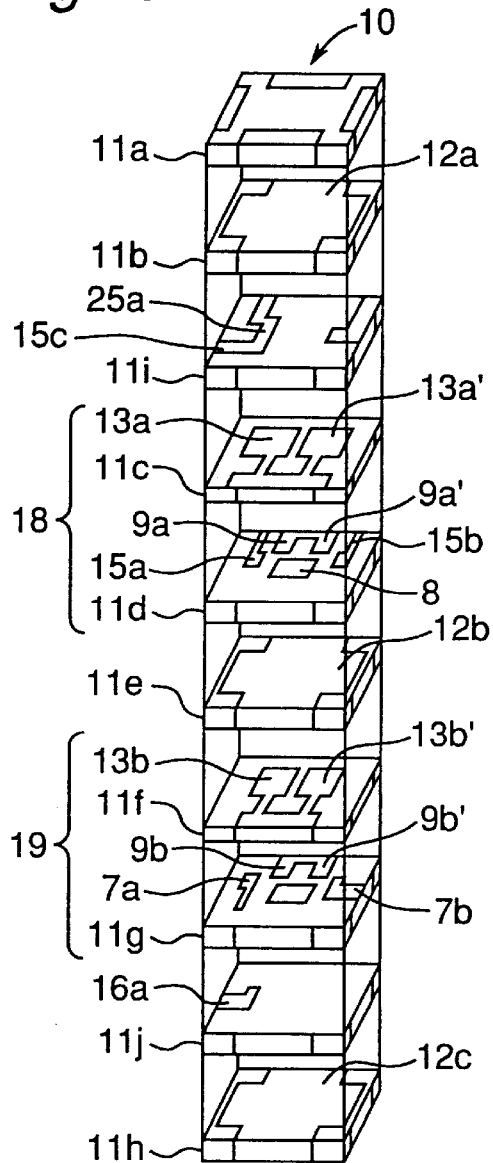
FIG. 13 is an exploded perspective view of a dual-band multilayer bandpass filter according to a third embodiment of the present invention.
Figure 14:
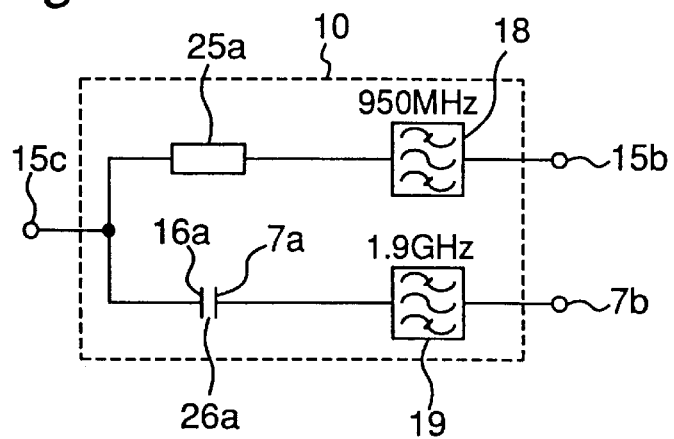
FIG. 14 is a circuit diagram of a dual-band multilayer bandpass filter of FIG. 13.

Referring to FIGS. 13 and 14, a third embodiment of the dual-band multilayer bandpass filter is shown. The second embodiment shown in FIGS. 11 and 12 is one-input one-output type. The third embodiment shows one-input two-output type. When the arrangement of FIG. 13 is compared with that of FIG. 11, the difference is that the transmission line 25$b$ is eliminated, and the capacitance electrode 16$b$ is eliminated. The third embodiment can be also used as a two-input one-output type, by using the electrodes 15$b$ and 7$b$ as inputs and electrode 15$c$ as output.

EMBODIMENT 4

Figure 15:
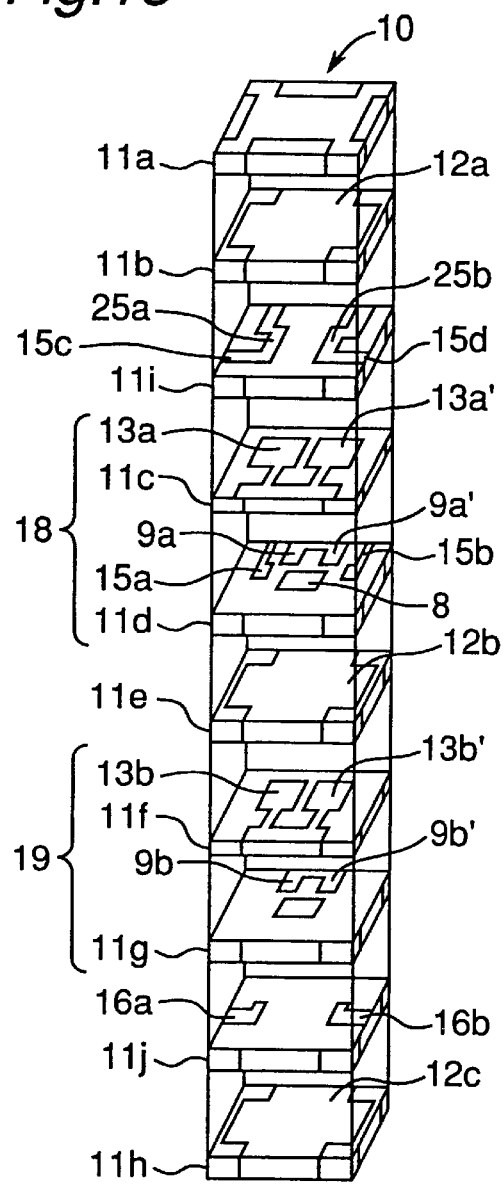
FIG. 15 is an exploded perspective view of a dual-band multilayer bandpass filter according to a fourth embodiment of the present invention.
Figure 16:
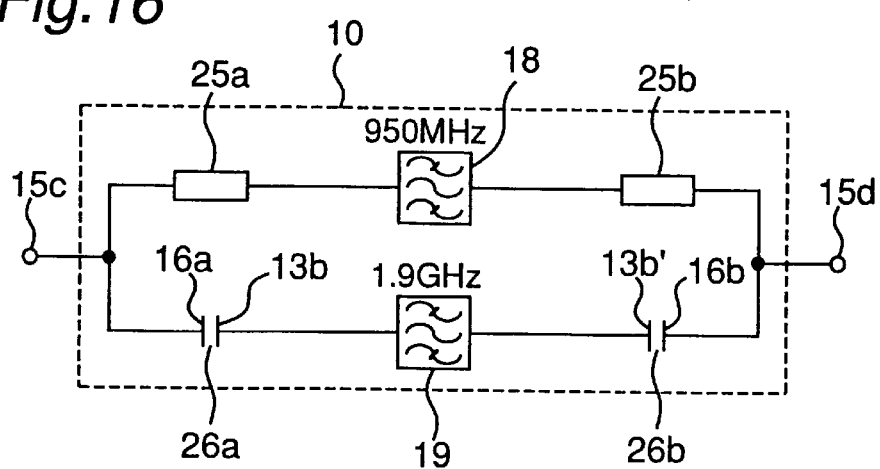
FIG. 16 is a circuit diagram of a dual-band multilayer bandpass filter of FIG. 15.

Referring to FIGS. 15 and 16 a fourth embodiment of the dual-band multilayer bandpass filter is shown. When the arrangement of FIG. 15 is compared with that of FIG. 11, the difference is that in FIG. 15 the electrodes 7$a$ and 7$b$ are eliminated. Thus, the capacitors for the secondary filters are obtained by the capacitance between electrodes 16$a$ and 13$b$, and also between electrodes 16$b$ and 13$b'$. By this arrangement, the coupling between the input and output can be adjusted.

EMBODIMENT 5

Figure 17:
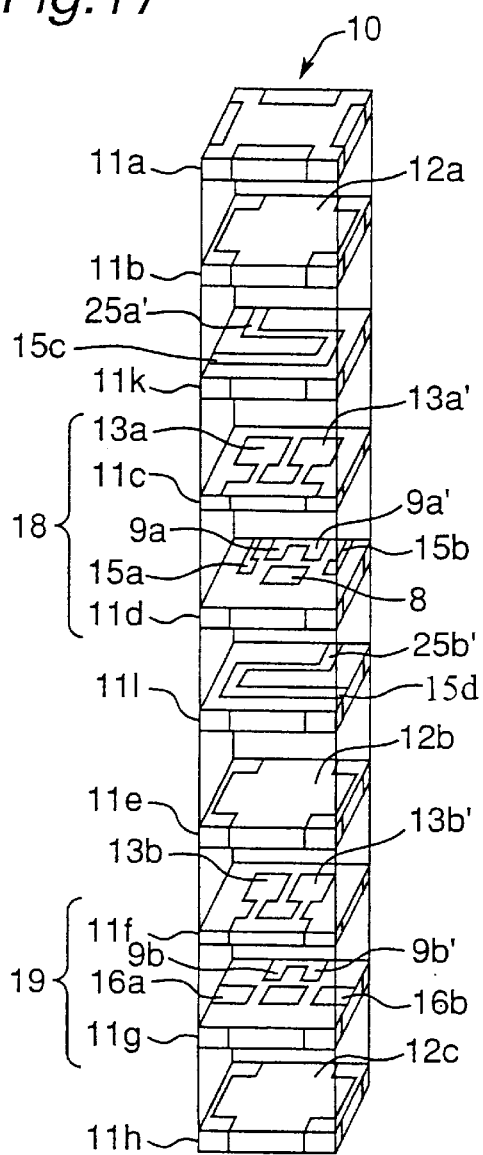
FIG. 17 is an exploded perspective view of a dual-band multilayer bandpass filter according to a fifth embodiment of the present invention.
Figure 18:
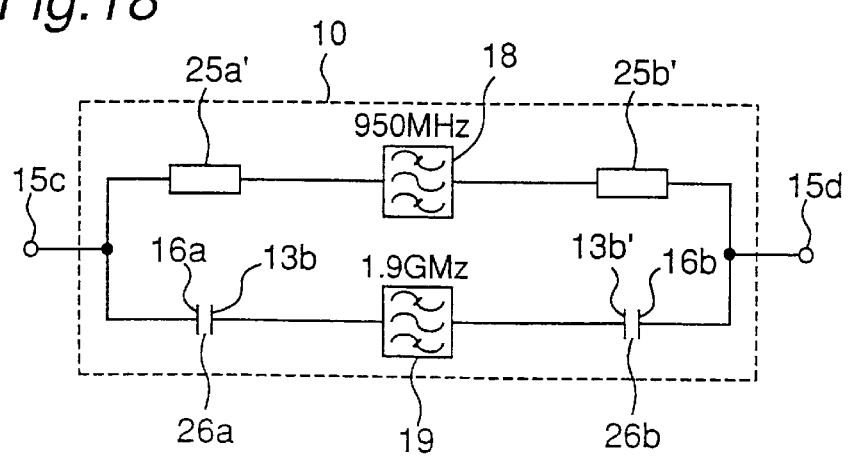
FIG. 18 is a circuit diagram of a dual-band multilayer bandpass filter of FIG. 17.

Referring to FIGS. 17 and 18, a fifth embodiment of the dual-band multilayer bandpass filter is shown. When the arrangement of FIG. 17 is compared with that of FIG. 11, the difference is that in FIG. 17, transmission lines 25$a$ and 25$b$ are provided in the separate ceramic layers. More specifically, the transmission line 25$a'$ is provided on a ceramic layer 11$k$ above the first filter unit 18 and the transmission line 25$b'$ is provided on a ceramic layer 11$l$ below the first filter unit 18.

A further difference is that in FIG. 17, the layer 11$j$ is eliminated, and the electrodes 16$a$ and 16$b$ are provided on layer 11$g$.

By the fifth embodiment, more freedom is added to make the transmission lines 25$a'$ and 25$b'$ in a desired length or configuration.

EMBODIMENT 6

Figure 19:
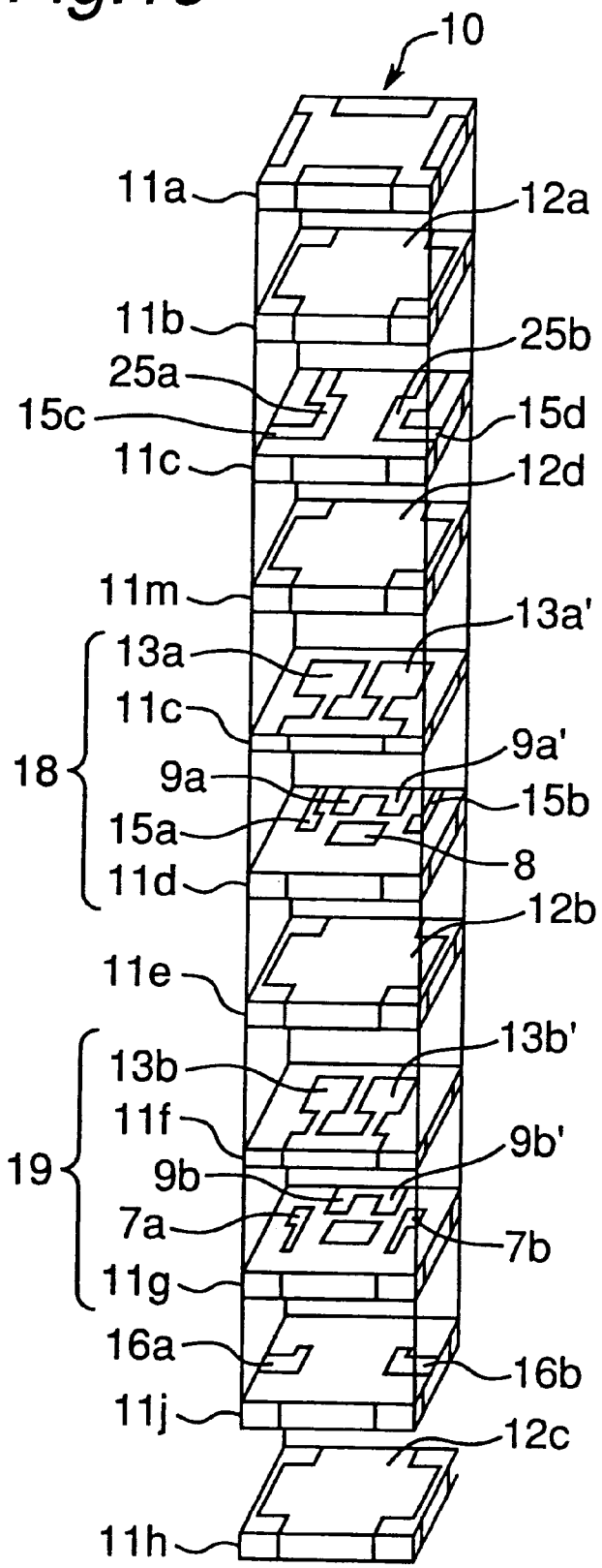
FIG. 19 is an exploded perspective view of a dual-band multilayer bandpass filter according to a sixth embodiment of the present invention.

Referring to FIG. 19, a sixth embodiment of the dual-band multilayer bandpass filter is shown. When the arrangement of FIG. 19 is compared with that of FIG. 11, the difference is that in FIG. 19, a layer 11$m$ with a shield electrode 12$d$ is inserted between the layers 11$i$ and 11$c$. By this arrangement, the coupling between the electrodes on the layer 11$i$ and the electrodes on the layer 11$c$ can be prevented.

EMBODIMENT 7

Figure 20:
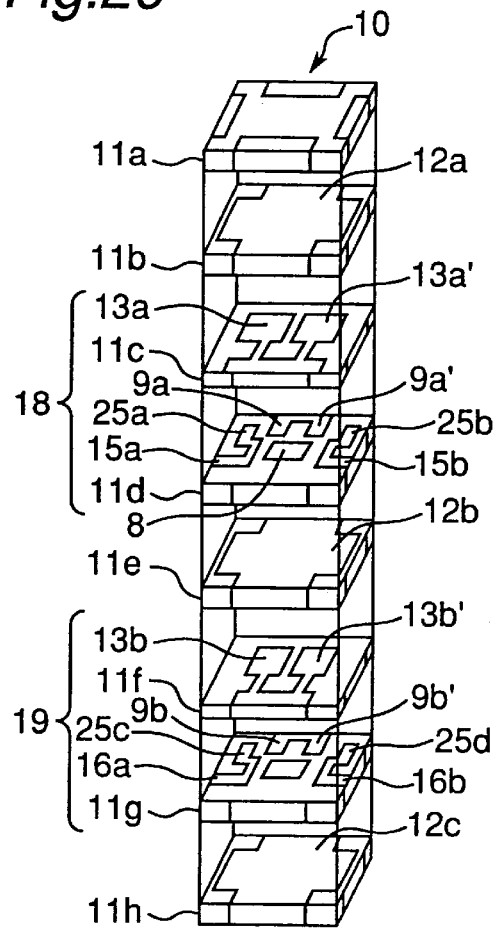
FIG. 20 is an exploded perspective view of a dual-band multilayer bandpass filter according to a seventh embodiment of the present invention.

Referring to FIG. 20, a seventh embodiment of the dual-band multilayer bandpass filter is shown. When the arrangement of FIG. 20 is compared with that of FIG. 11, the difference is that in FIG. 20, the layers 11$i$ and 11$j$ with the transmission lines 25$a$ and 25$b$ and electrodes 16$a$ and 16$b$ are eliminated, and instead, transmission lines 25$a$ and 25$b$ are provided on layer 11$d$ extending from input and output electrodes 15$a$ and 15$b$, and transmission lines 25$c$ and 25$d$ are provided on layer 11$g$ extending from input and output electrodes 16$a$ and 16$b$.

Figure 21:
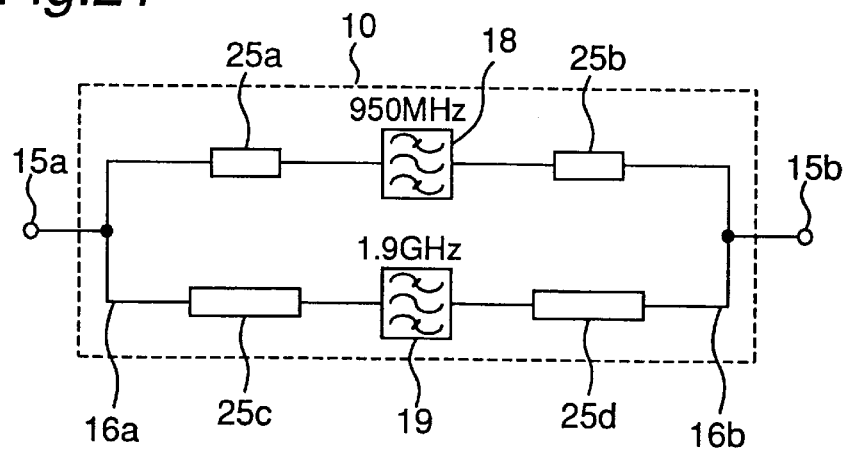
FIG. 21 is a circuit diagram of a dual-band multilayer bandpass filter of FIG. 20.

FIG. 21 shows an equivalent circuit of the filter shown in FIG. 20. In this embodiment, the secondary filters are all formed by transmission lines. The length of the transmission lines 25$a$ and 25$b$ is made shorter than that of the transmission lines 25$c$ and 25$d$. Thus, the transmission lines 25$a$ and 25$b$ show high impedance with respect to 1.9 GHz, and low impedance with respect to 950 MHz. Similarly, the transmission lines 25$c$ and 25$d$ show low impedance with respect to 1.9 GHz, and high impedance, or open, with respect to 950 MHz.

EMBODIMENT 8

Figure 22:
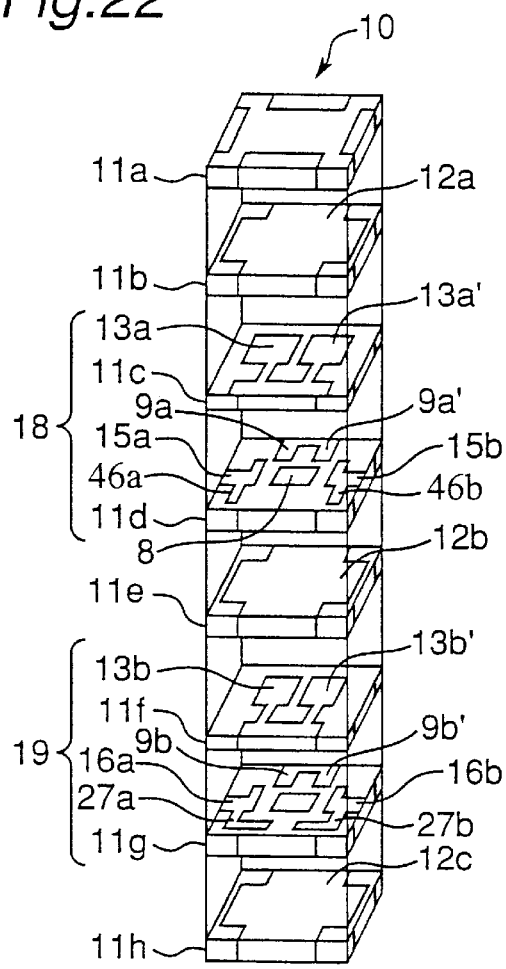
FIG. 22 is an exploded perspective view of a dual-band multilayer bandpass filter according to a eighth embodiment of the present invention.

Referring to FIG. 22, an eighth embodiment of the dual-band multilayer bandpass filter is shown. When the arrangement of FIG. 22 is compared with that of FIG. 11, layers 11$i$ and 11$j$ with the transmission lines 25$a$ and 25$b$ and electrodes 16$a$ and 16$b$ are eliminated, and instead, open stubs 46$a$ and 46$b$ are provided on layer 11$d$ branching from input and output electrodes 15$a$ and 15$b$, and another open stubs 27$a$ and 27$b$ are provided on layer 11$g$ branching from input and output electrodes 16$a$ and 16$b$.

Figure 23:
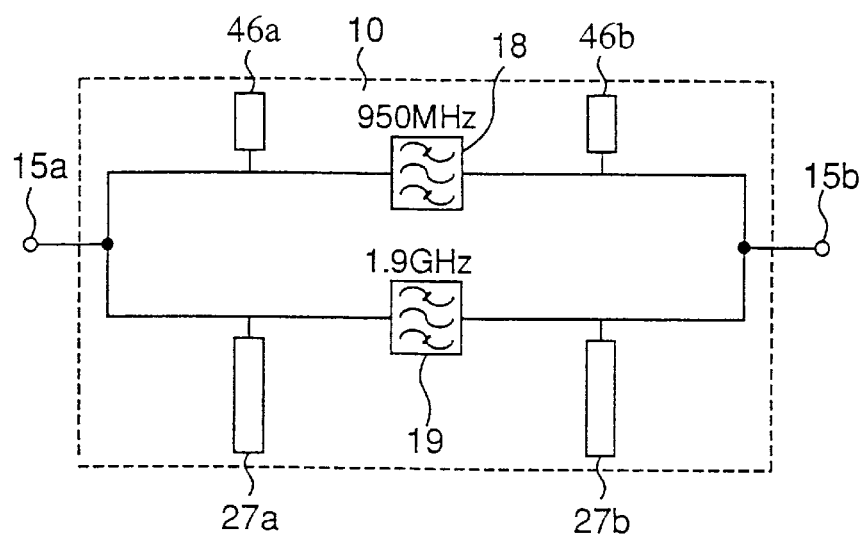
FIG. 23 is a circuit diagram of a dual-band multilayer bandpass filter of FIG. 22.

FIG. 23 shows an equivalent circuit of the filter shown in FIG. 22. In this embodiment, the secondary filters are all formed by open stubs. The length of the open stubs 46$a$ and 46$b$ is made shorter than that of the open stubs 27$a$ and 27$b$. Thus, the open stubs 46$a$ and 46$b$ prevents the transmission of 1.9 GHZ signal to the first filter unit 18, and the open stubs 27$a$ and 27$b$ prevents the transmission of 950 MHz signal to the second filter unit 19.

The open stubs 46$a$ and 46$b$ can be formed in any other location or layer in the first filter unit 18, as long as the open stub branches from the electrode in the first filter unit 18. Similarly, the open stubs 27$a$ and 27$b$ can be formed in any other location or layer in the second filter unit 19, as long as the open stub branches from the electrode in the second filter unit 19.

EMBODIMENT 9

Figure 24:
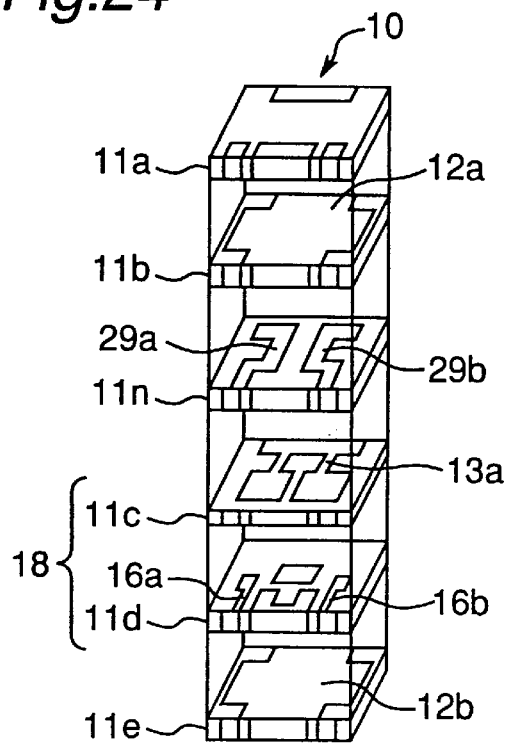
FIG. 24 is an exploded perspective view of a dual-band multilayer bandpass filter according to a ninth embodiment of the present invention.

Referring to FIG. 24, a ninth embodiment of the dual-band multilayer bandpass filter is shown. This arrangement has one primary filter, which is filter unit 18, for filtering 950 MHz signal, and one secondary filter, defined by open stubs 29a and 29b, for filtering 1.9 GHz. As shown in FIG. 24, this arrangement has layers 11a, 11b, 11n, 11c, 11d and 11e. The layers 11a, 11b, 11c, 11d and 11e are the same as those shown in FIG. 11. The layer line is inserted between layers 11b and 11c and is provided with open stubs 29a and 29b. The configuration and positioning of the open stubs 29a and 29b are so arranged that stubs 29a and 29b are electromagnetically coupled to filter the 1.9 GHz signal.

Figure 25:
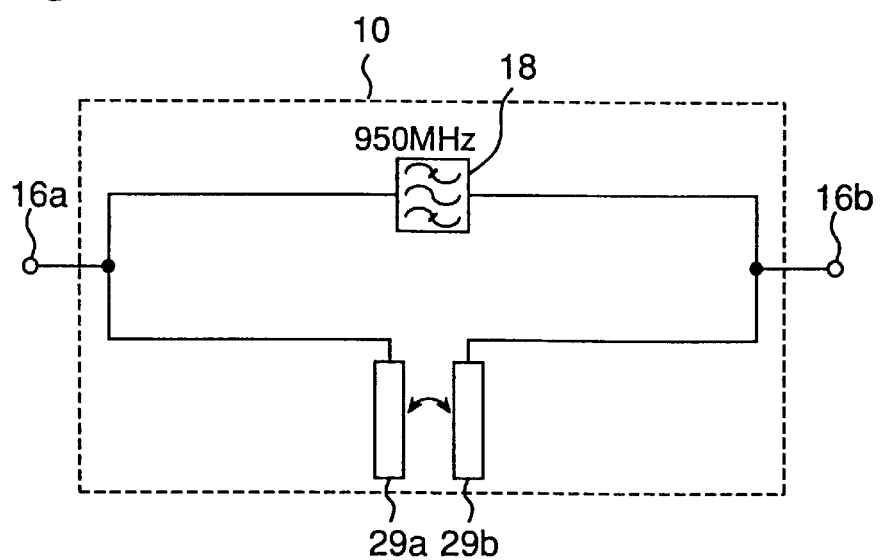
FIG. 25 is a circuit diagram of a dual-band multilayer bandpass filter of FIG. 24.

FIG. 25 shows an equivalent circuit of the filter shown in FIG. 24. In this embodiment, no secondary filter is provided for filtering the 950 MHz signal, and no primary filter is provided for filtering the 1.9 GHz signal. The open stubs 29a and 29b prevents the transmission of 950 MHz signal, and at the same time, the open stubs 29a and 29b are electromagnetically coupled to transmit 1.9 GHz signal.

According to this embodiment, the distance between the shield electrodes 12a and 12b can be made relatively great, and the Q factor of the resonator is thus high, and a filter with less loss can be achieved.

EMBODIMENT 10

Figure 26:
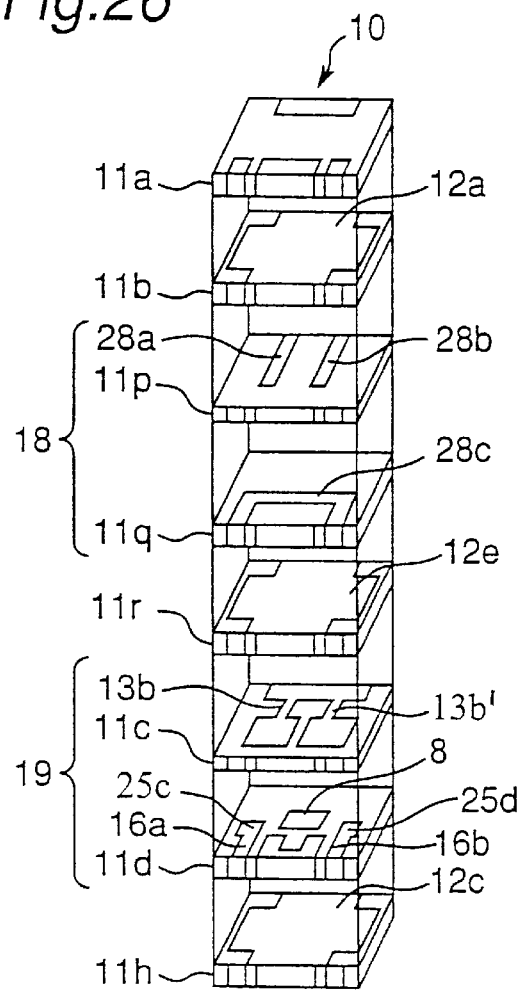
FIG. 26 is an exploded perspective view of a dual-band multilayer bandpass filter according to a tenth embodiment of the present invention.

Referring to FIG. 26, a tenth embodiment of the dual-band multilayer bandpass filter is shown. This arrangement has one primary filter, which is filter unit 19, for filtering 1.9 GHz signal, and one secondary filter, which is a notch filter defined by strip lines 28a, 28b and 28c, for filtering 950 MHz. When the arrangement of FIG. 26 is compared with that of FIG. 24, the difference is that in FIG. 26, the layer 11n with the stubs 29a and 29b is eliminated, and instead, layers 11p, 11q and 11r are inserted. Layer 11p has two parallel strip lines 28a and 28b. Layer 11q has one strip line 28c extended vertically to the strip lines 28a and 28b. Layer 11r has a shield electrode 12e. The configuration and positioning of the strip lines 28a, 28b and 28c are so arranged that signals having frequency higher than 950 MHz are cut off.

Figure 27:
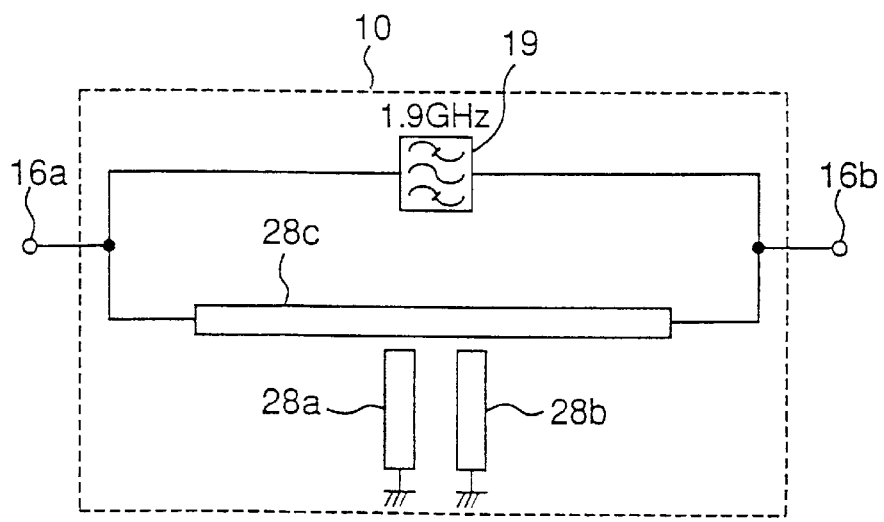
FIG. 27 is a circuit diagram of a dual-band multilayer bandpass filter of FIG. 26.
Figure 28:
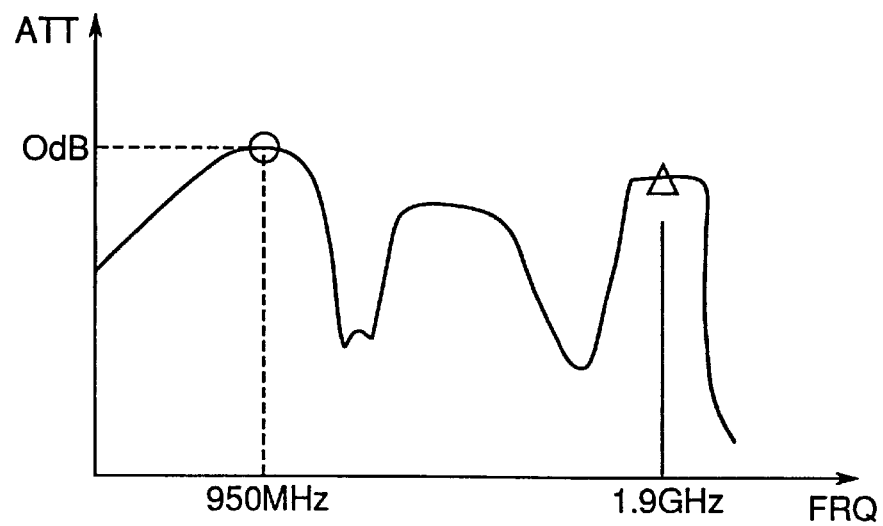
FIG. 28 is a graph showing a characteristics of the filter of FIG. 26.

FIG. 27 shows an equivalent circuit of the filter shown in FIG. 26, and FIG. 28 shows a characteristic graph.

The invention being thus described, it will be obvious that the same may be varied in many ways. Such variations are not to be regarded as a departure-from the spirit and scope of the invention, and all such modifications as would be obvious to one skilled in the art are intended to be included within the scope of the following claims.

What is claim is:

1. A multilayer bandpass filter comprising:
a first filter unit comprising a plurality of stacked ceramic layers having a strip line resonator and a coupling electrode;
a second filter unit comprising a plurality of stacked ceramic layers having a strip line resonator and a coupling electrode;
a shield electrode inserted between said first and second filter units;
said second filter unit being stacked under said first filter unit to define a stacked structure;
a first input electrode for input of said first filter unit formed on an outer surface of said stacked structure and extending in the stacked direction;
a first output electrode for output of said first filter unit formed on said outer surface of said stacked structure and extending in the stacked direction;
a second input electrode for input of said second filter unit formed on said outer surface of said stacked structure and extending in the stacked direction;
a second output electrode for output of said second filter unit formed on said outer surface of said stacked structure and extending in the stacked direction;
a first ground electrode formed on said outer surface of said stacked structure and extending in the stacked direction and located between said first input electrode and said first output electrode; and
a second ground electrode formed on said outer surface of said stacked structure and extending in the stacked direction and located between said second input electrode and said second output electrode;
wherein said first and second input and output electrodes are provided separately and each have their end portions bent over the top and bottom surfaces of the stacked structure.

2. A multilayer bandpass filter according to claim 1, wherein said second input electrode extends partially in the stacked direction.

3. A multilayer bandpass filter according to claim 1, wherein said second output electrode extends partially in the stacked direction.

4. A dual-band multilayer bandpass filter having at least one of dual-band transmission frequencies and dual-band reception frequencies, the dual-band multilayer bandpass filter comprising:
a first filter unit for filtering a first signal having a first frequency, and comprising a plurality of stacked ceramic layers having a strip line resonator and a coupling electrode, and forming a first capacitor at an input side of said first filter unit and a second capacitor at an output side of said first filter unit;
a second filter unit for filtering a second signal having a second frequency greater than said first frequency, and comprising a plurality of stacked ceramic layers having a strip line resonator and a coupling electrode, and forming a third capacitor at an input side of said second filter unit and a fourth capacitor at an output side of said second filter unit;
a shield electrode inserted between said first and second filter units;
said second filter unit stacked under said first filter unit to define a stacked structure;
a first blocking element coupled to at least one of said first and second capacitors of said first filter unit for blocking said second signal from being applied to said first filter unit; and
a second blocking element that is independent of the first blocking element and is coupled to at least one of said third and fourth capacitors of said second filter unit for blocking said first signal from being applied to said second filter unit.

5. The dual-band multilayer bandpass filter according to claim 4, wherein the first filter is implemented on a first layer including a plurality of electrodes forming the first and second capacitors and a second layer including the strip line resonator, and wherein the first blocking element is implemented on a third layer that is stacked on the second layer,
the second filter is implemented on a fourth layer including a plurality of electrodes forming the third and fourth capacitors and a fifth layer including the strip line resonator, and wherein the second blocking element is implemented by at least one of the electrodes provided on the fourth layer and a plurality of electrodes provided in a sixth layer that is stacked under the fourth layer.

6. A dual-band multilayer bandpass filter according to claim 4, wherein said first blocking element is connected to an input side of said first filter unit, and wherein said second blocking element is connected to an input side of said second filter unit, and said first and second blocking elements on the input side are connected to each other to present a one-input two-output dual-band multilayer bandpass filter.

7. A dual-band multilayer bandpass filter according to claim 4, wherein said first blocking element is connected to an output side of said first filter unit, and wherein said second blocking element is connected to an output side of said second filter unit, and said first and second blocking elements on the output side are connected to each other to present a two-input one-output dual-band multilayer bandpass filter.

8. A dual-band multilayer bandpass filter according to claim 4, wherein said first blocking element is an inductor externally connected to said first filter unit.

9. A dual-band multilayer bandpass filter according to claim 4, wherein said second blocking element is a capacitor externally connected to said second filter unit.

10. A dual-band multilayer bandpass filter according to claim 4, wherein said first blocking element is a strip line inductor formed on a ceramic layer in said stacked structure.

11. A dual-band multilayer bandpass filter according to claim 10, wherein said ceramic layer with said strip line inductor has a dielectric constant different from that of other ceramic layers.

12. A dual-band multilayer bandpass filter according to claim 4, wherein said second blocking element is a capacitor formed by a pair of electrodes formed on ceramic layers in said stacked structure.

13. A dual-band multilayer bandpass filter according to claim 4, wherein said second blocking element is a strip line inductor formed on a ceramic layer in said stacked structure.

14. A dual-band multilayer bandpass filter according to claim 4, wherein said first blocking element is an open stub formed on a ceramic layer in said stacked structure.

15. A dual-band multilayer bandpass filter according to claim 4, wherein said second blocking element is an open stub formed on a ceramic layer in said stacked structure.

16. A dual-band multilayer bandpass filter according to claim 4, wherein said stacked structure is co-fired.

17. A dual-band multilayer bandpass filter comprising:

a first filter unit that filters a first signal having a first frequency, and comprises a plurality of stacked ceramic layers having a strip line resonator and a coupling electrode;

a second filter unit that filters a second signal having a second frequency that is higher than the first frequency, and that blocks the first frequency, the second filter unit comprising a stacked ceramic layer having open stubs electro-magnetically coupled; and said second filter unit stacked under said first filter unit to define a stacked structure.

18. The dual-band multilayer bandpass filter according to claim 17, wherein an input side of the first filter unit and an input side of the second filter unit are connected to each other, and an output side of the first filter unit and an output side of the second filter unit are connected to each other to present a one-input one-output dual-band multilayer bandpass filter.

19. The dual-band multilayer bandpass filter according to claim 17, wherein the first filter unit is implemented on a first layer including the strip line resonator and a second layer including the coupling electrode, the second layer being stacked under the first layer, and the second filter unit is implemented on a third layer including the open stubs, the third layer being stacked on the first layer.

20. A multilayer bandpass filter comprising:

a first filter unit that filters a first signal having a first frequency, and comprises a plurality of stacked ceramic layers having a strip line resonator and a coupling electrode;

a second filter unit that filters a second signal having a second frequency greater than said first frequency, the second filter unit comprising a plurality of stacked ceramic layers having a strip line resonator and a coupling electrode;

a shield electrode inserted between said first and second filter units;

said second filter unit stacked under said first filter unit to define a stacked structure;

a first blocking element coupled to said first filter unit for blocking said second signal from being applied to said first filter unit; and a second blocking element coupled to said second filter unit for blocking said first signal from being applied to said second filter unit, wherein said first blocking element is connected to an input side and an output side of said first filter unit, and wherein said second blocking element is connected to an input side and an output side of said second filter unit, and said first and second blocking elements are connected to each other on the input side, and said first and second blocking elements are connected to each other on the output side to present a one-input one-output dual-band multilayer bandpass filter.

21. A dual-band multilayer bandpass filter comprising:

a first filter unit that filters a first signal having a first frequency, and comprises a plurality of stacked ceramic layers having a strip line resonator and a coupling electrode;

a second filter unit that filters a second signal having a second frequency that is lower than the first frequency and blocks a signal having a frequency larger than the second signal, the second filter comprising a plurality of stacked ceramic layers having open stubs and a strip line constituting a notch filter; and said first filter unit stacked under said second filter unit to define a stacked structure.

22. The dual-band multilayer bandpass filter according to claim 21, wherein an input side of the first filter unit and an input side of the second filter unit are connected to each other, and an output side of the first filter unit and an output side of the second filter unit are connected to each other to present a one-input one-output dual-band multilayer bandpass filter.

23. The dual-band multilayer bandpass filter according to claim 21, wherein the first filter unit is implemented on a first layer including the strip line resonator and a second layer including the coupling electrode, the second layer being stacked under the first layer, and the second filter unit is implemented on a third layer including the strip line and a fourth layer including the open stubs, the third layer being stacked under the fourth layer.

* * * * *